US012638485B2

(12) United States Patent
Gahan et al.

(10) Patent No.: US 12,638,485 B2
(45) Date of Patent: May 26, 2026

(54) SYSTEM AND METHOD FOR NON-INVASIVE SENSING OF RADIO-FREQUENCY CURRENT SPECTRA FLOWING IN A PLASMA PROCESSING CHAMBER

(71) Applicant: Applied Materials, Inc., Santa Clara, CA (US)

(72) Inventors: David Gahan, Terenure (IE); Paul Scullin, Lucan (IE)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 18/121,209

(22) Filed: Mar. 14, 2023

(65) Prior Publication Data

US 2023/0305045 A1 Sep. 28, 2023

(30) Foreign Application Priority Data

Mar. 25, 2022 (EP) ..................................... 22164269

(51) Int. Cl.
| | |
|---|---|
| *G01R 23/16* | (2006.01) |
| *G01R 1/02* | (2006.01) |
| *G01R 1/04* | (2006.01) |
| *G01R 1/067* | (2006.01) |
| *G01R 1/073* | (2006.01) |
| *G01R 1/20* | (2006.01) |
| *H01J 37/32* | (2006.01) |

(52) U.S. Cl.
CPC ........ *G01R 23/16* (2013.01); *H01J 37/32082* (2013.01); *H01J 2237/24564* (2013.01); *H01J 2237/334* (2013.01)

(58) Field of Classification Search
CPC ... G01R 1/02; G01R 1/04; G01R 1/06; G01R 1/067; G01R 1/073; G01R 1/20; G01R 23/16; H01J 37/32; H01J 37/329
See application file for complete search history.

(56) References Cited

U.S. PATENT DOCUMENTS

| | | | | |
|---|---|---|---|---|
| 5,576,629 A | * | 11/1996 | Turner | H01J 37/32183 |
| | | | | 336/155 |
| 9,620,337 B2 | * | 4/2017 | Valcore, Jr. | G01R 31/40 |
| 10,020,168 B1 | * | 7/2018 | Howald | H01J 37/3299 |
| 10,102,321 B2 | * | 10/2018 | Povolny | G06F 30/367 |

(Continued)

FOREIGN PATENT DOCUMENTS

| | | | |
|---|---|---|---|
| EP | 2877864 B1 | | 4/2017 |
| WO | WO0122470 | * | 3/2001 |

(Continued)

OTHER PUBLICATIONS

Search Opinion and Report, EP Application No. 22164269.7, dated Sep. 2, 2022, pp. 6.

(Continued)

*Primary Examiner* — Neel D Shah
(74) *Attorney, Agent, or Firm* — Patterson + Sheridan, LLP

(57) ABSTRACT

A system for non-invasive sensing of radio-frequency current spectra. In one example, the system comprises a plasma processing chamber, a plasma generator, and a shunt connector having a resistor therein. In one example, the shunt connector is attached across an opening in a ground-return path between the chamber and the generator.

16 Claims, 6 Drawing Sheets

(56)                References Cited

U.S. PATENT DOCUMENTS

| | | |
|---|---|---|
| 2007/0227667 A1 | 10/2007 | Yamazawa |
| 2007/0252580 A1 | 11/2007 | Dine et al. |
| 2019/0288737 A1* | 9/2019 | Hanks ..................... H04B 1/44 |
| 2023/0178337 A1* | 6/2023 | Kozakevich ...... H01J 37/32183 |
| | | 216/67 |

FOREIGN PATENT DOCUMENTS

| | | | |
|---|---|---|---|
| WO | 2004006298 | A2 | 1/2004 |
| WO | 2014016357 | A2 | 1/2014 |
| WO | 2018177965 | A1 | 10/2018 |

OTHER PUBLICATIONS

A. Salar Elahi and M. Ghoranneviss, "A Modified Flux Loop for the Determination of Plasma Position in IR-T1 Tokamak," in IEEE Transactions on Plasma Science, vol. 38, No. 11, pp. 3163-3167, Nov. 2010, doi: 10.1109/TPS.2010.2066289.
Leibson, Steve: "Fundamentals of Current Measurement: Part 2 | Digikey," Jul. 11, 2018, XP055954406.

* cited by examiner

SYSTEM AND METHOD FOR NON-INVASIVE SENSING OF RADIO-FREQUENCY CURRENT SPECTRA FLOWING IN A PLASMA PROCESSING CHAMBER

CROSS-REFERENCE TO RELATED APPLICATIONS

This application claims priority to European Patent Application No. EP22164269, filed Mar. 25, 2022, the entire contents of each are incorporated herein by reference.

FIELD

The present teachings relate to the remote sensing and analysis of current signals in plasma systems at radio-frequencies

BACKGROUND OF THE INVENTION

Plasma processing of materials is ubiquitous in modern industrial manufacturing. A common example is the etching and deposition of layers to form transistors during the manufacture of integrated circuits in the semiconductor industry. Plasma processing is also used in the manufacture of solar panels, flat panel displays, thin film coatings and medical devices—to name but a few.

The processing plasma is generated in a vacuum chamber at low pressure. The air is evacuated and a gas recipe is added to the chamber at a chosen gas pressure. Energy is supplied to the vacuum chamber, usually electrical energy, to excite the gas to the plasma state. The plasma produces the ions needed to modify the surface of the work-piece during processing.

Electrical energy in the radio-frequency (RF) band is commonly used to power plasma processes. DC, pulsed DC and microwave power are also commonly used. The RF range is typically between tens of kilohertz and hundreds of megahertz. In RF plasmas, the RF generator supplies power to the plasma chamber through a matching network to maximise power transfer. Power can be coupled to the plasma in a number of different ways. In one configuration, a RF powered electrode can be used to excite the plasma. An electric field (E-field) applied between the powered electrode and a counter electrode, and/or the chamber vessel body, causes electrical breakdown of the process gas to form a plasma. RF currents sustain the discharge, flowing from the generator to the powered electrode and through the plasma to the counter electrode and/or chamber body. The currents then flow back to the generator through the ground return path. Electrons, stripped from their parent atoms and molecules, oscillate back and forward in the electric fields, ionizing the background gas in the process, thus sustaining the plasma.

In another configuration the RF power is coupled to the plasma through a RF antenna. The antenna does not need to be in direct contact with the background gas. RF current flowing through the antenna induces a time varying magnetic field, perpendicular to the direction of current flow. The magnetic field is commonly coupled to the chamber through a dielectric window. Once breakdown occurs, the magnetic field induces an E-field in the plasma which drives RF current. The free electrons oscillate in the RF fields, ionizing the background gas, thus sustaining the plasma. Many other plasma reactor configurations and plasma generation mechanisms exist, to which the current invention could also be applied.

Regardless of the type of RF coupling mechanism, an interface region between electrode or antenna and the plasma forms. This region is called a plasma sheath. The sheath has a non-linear RF impedance. Consequently, harmonics of the fundamental driving frequency are generated. The RF plasma voltages and currents can have rich harmonic spectra as a result. The RF harmonic signature of the plasma process is determined by many variables including the fundamental plasma parameters, the plasma chemistry, the chamber geometry, the chamber surface conditions and the mechanical characteristics of the chamber. The harmonic spectrum thus contains significant information about the plasma process health and performance. Depending on the plasma reactor configuration, there will be one or more driving frequencies. A harmonic spectrum for each fundamental driving frequency as well as the intermodulation frequencies. A non-invasive sensing apparatus to measure the RF harmonic spectra generated in RF powered plasma reactors is highly desirable. Accurately measured harmonic spectral signatures can be used to monitor process performance in real time. There have been many methods and sensing apparatuses developed to measure the RF spectra in RF plasma processes.

VI sensors are commonly used for measuring RF voltage and current spectra flowing in the transmission line or RF path between RF generator and the plasma chamber. The VI sensing elements are generally brought into close proximity with the current carrying conductor, under the grounded shielding, to measure the outbound RF voltage and current signals.

In WO 2014/016357 A2, a VI sensor apparatus is described. This sensor is designed to be connected in series with the RF power feed line. It includes a section of transmission line, as is generally the case for this type of sensor. A broadband capacitive pick-up (E-field probe) is used to determine the voltage signal on the RF line connected to the plasma. An inductive loop (B-dot probe) is used to determine the RF current in the RF line connected to the plasma. The voltage and current pick-ups are embedded in the RF transmission line section of the VI sensor structure. The signal representing the current and voltage are passed to an analog-to-digital converter (ADC), and the digitised signals are processed in a field programmable gate array. While the inline VI sensor is a very important tool, it can be difficult to install without major modification to the plasma system configuration. The VI sensor may not be as sensitive to changes in plasma conditions as the apparatus provided by the current invention.

Another group of sensing devices make use of the fact that regions of the plasma processing system can be "leaky" to the electromagnetic fields associated with the RF voltages applied to, and the RF currents flowing through, the system. The RF time-varying electric and magnetic fields radiate through any non-shielded or improperly grounded regions.

Chamber viewports, often used to monitor optical emission from the plasma, are an example of a gap, or opening, in the plasma system from which RF fields leaking from the processing chamber can be monitored. Several prior art inventions sense RF spectra radiating from openings in the plasma processing system, such as viewports, using time-varying electric (E) field sensors and/or time varying magnetic (B) field sensors. Capacitive pickups are typically used to detect the E-field spectra while inductive loops are typically used to detect B-field spectra.

Through the processing and analysis of the sensed RF spectra, the plasma process can be monitored in real time. To avoid the need for detailed calibration of the measured RF spectra, statistical methods can be used to baseline or fingerprint certain process conditions. This is typically done for known "healthy" processes. Subsequent processes, for the same setpoints, can be compared against the baseline to check for statistically significant changes. Gross changes will be easily detected in a single frequency channel while other changes may be more nuanced and may require multivariate analysis using many data channels from the RF harmonic spectra to detect them e.g. minor air leaks or slight wafer misplacement.

Elahi and Ghoranneviss (IEEE transactions on plasma science, vol. 38, no. 11, November 2010) present a novel technique for the determination of the plasma position by sensing the plasma currents inside a chamber using inductive loops installed outside the chamber vessel of the IR-T1 tokamak.

In WO 2018/177965 A1 an apparatus is described in which a specially designed magnetic loop antenna is used to sense the plasma current flowing in the vicinity of a plasma chamber viewport from an external location. The antenna is carefully designed and calibrated. The output of the antenna is coupled to a spectrum analyser to view the frequency spectrum detected by the antenna. The inventors describe a frequency analysis technique to detect resonant features of the plasma. Good agreement is obtained between this apparatus and an inline VI sensor as well as an OES detector.

In WO 2004/006298 A2 an apparatus is described that utilises a RF antenna to sense RF radiation from a plasma system remotely. The antenna can detect harmonic signals and is coupled to a processing unit for analysis. The processing unit is coupled to the plasma tool controller, where the sensed RF signals are used to adjust and maintain parameters of the plasma process based on the measured signal levels.

US 2007/0227667 describes an apparatus consisting of two magnetic loop antennas, positioned inside the plane of the plasma chamber wall. The antennas are placed near the two electrodes of a capacitively coupled plasma reactor.

Voltage signals generated by the magnetic flux threading each loop are coupled to a signal processing unit. The current flowing out of the plasma to the chamber wall is thus calculated.

There are several limitations to the inductive/magnetic loop type of sensing apparatus used to measure RF fields emanating from viewport windows or other regions of the plasma system including:

a) The glass window attenuates the magnetic fields and the attenuation is frequency dependent. Therefore, it is hard to get an accurate reflection of the relative intensities of the harmonic signals inside the chamber;

b) Lower plasma driving frequencies (e.g. 400 kHz) have large wavelengths and require large viewports or gaps in the system for sufficient signal levels to escape for detection;

c) Some chambers have grounded mesh shields on the inside of the window, specifically to block RF magnetic field leakage;

d) The orientation, placement and dimensions of the loop are critical to determining the sensed signal levels, which makes it difficult to get a repeatable measurement after replacement of the loop after maintenance;

e) Since the inductive loop is used to sense the magnetic flux threading the loop, it is susceptible to interference from sources other than that intended e.g. from nearby plasma chambers; and f) Temperature variations at the installation site, with heated chambers for example, can cause the loop dimensions, and hence the loop signal levels, to vary during a plasma process which could be misinterpreted as a fault state.

The current invention overcomes many of the issues and limitations associated with inductive loops used to detect RF spectra from a location external to a plasma chamber.

SUMMARY

In a first independent aspect of the invention, there is provided a system for non-Invasive sensing of radio-frequency current spectra comprising a plasma processing chamber, a plasma generator, and a shunt connector having a resistor therein, wherein the shunt connector is attached across an opening in a ground-return path between the chamber and the generator.

The system may be configured to detect only current in the ground-return path.

The sensor may also be configured such that current flowing through the ground return path generates a voltage in the resistor.

The system may further comprise an amplifier configured to sense a voltage drop across the resistor and output an RF signal.

Optionally, the shunt connector is configured to be attached across a viewport of the chamber.

The system may further comprise a digitisation circuit configured to take the RF signal from the amplifier and convert it to a digital signal for processing and analysis.

The output RF signal may be an alternating current signal in the RF band.

The system may further comprise a housing in which the resistor and amplifier are enclosed.

The system may be configured such that the shunt connector and the resistor create a path for current to flow as part of the ground return path.

Optionally, the path created by the shunt connector and the resistor is orientated in the same direction as current flow in the ground return path.

The shunt connector may comprises at least one of a ground shunt strap, cable, bar and rod.

In a second independent aspect of the invention there is provided a method for non-Invasive sensing of radio-frequency current spectra flowing in a plasma processing chamber comprising providing a shunt connector having a resistor therein, and attaching the shunt connector across an opening in a ground-return path between the chamber and a plasma generator.

The method may further comprise detecting only current in the ground-return path.

Optionally, current flowing through the ground return path generates a voltage in the resistor.

The method may further comprise attaching the shunt connector across a viewport of the chamber.

BRIEF DESCRIPTION OF THE DRAWINGS

The present application will now be described with reference to the accompanying drawings in which.

DETAILED DESCRIPTION OF THE DRAWINGS

Figure 1:
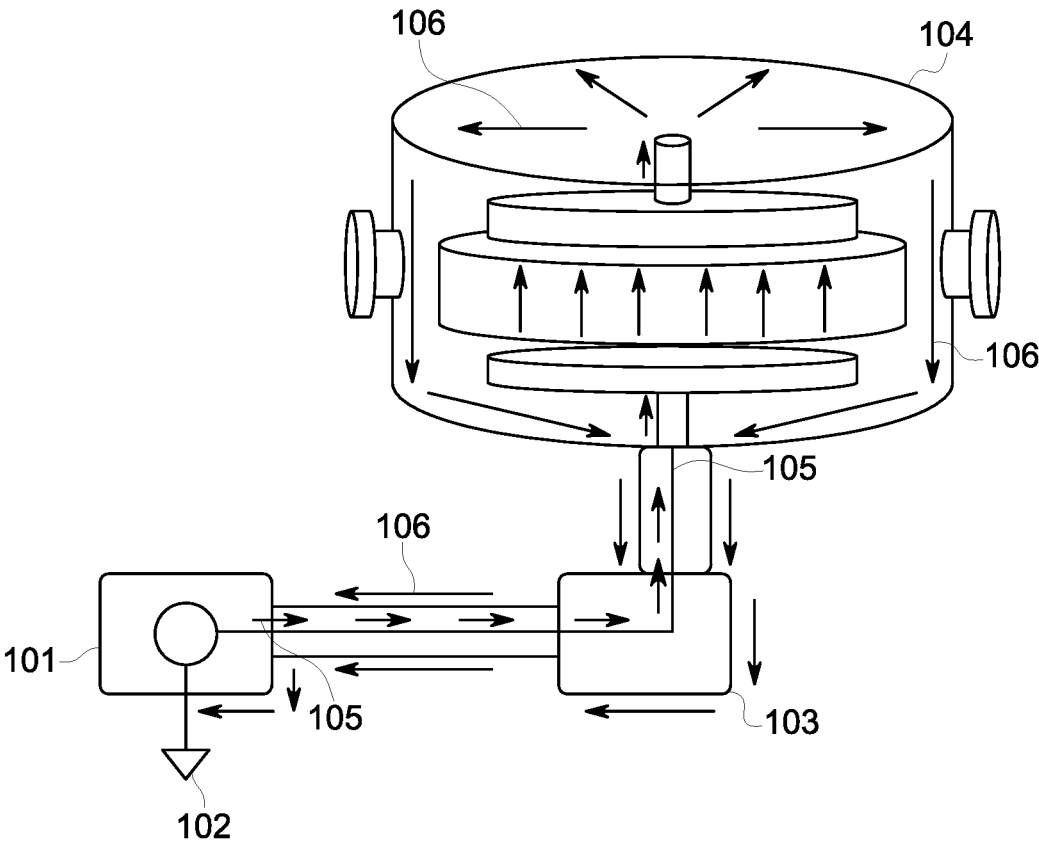
FIG. 1 shows an overview of a system in which the sensor in accordance with the present teachings can be used.

The current invention approaches the sensing of the RF spectra from a novel perspective. It makes use of the fact that the source of all RF plasma currents is the RF generator, and that these RF currents must return to the generator through the ground-return path. This is illustrated in FIG. 1. In particular, FIG. 1 shows a RF generator 101 (or plasma generator) connected to ground 102. A match unit 103 is provided in the transmission line or RF path between the RF generator 101 and the plasma chamber 104 as is known in the art. RF plasma currents flow in an outbound path 105 from the RF generator to the chamber 104. RF plasma currents return from the chamber 104 to the generator via a ground return path 106.

Prior art devices sense the RF current spectra on the outbound path 105, between the source (e.g., RF generator 101) and the start of the ground return path 106. As outlined in more detail herein after, the apparatus in accordance with the present teachings senses the RF currents on the return leg of the journey i.e., ground return path 106, between the start of the ground-return path and the generator. For a RF plasma reactor, the start of the ground-return path is typically the metallic chamber vessel body.

As will be described in more detail herein after, there is provided a sensor in accordance with the present teachings, which is comprised of a shunt connector, with an RF current sensing element, attached across an opening in the ground-return path of the plasma system, such as a viewport. The shunt connector could include a ground shunt strap, cable, bar or rod etc. Unlike prior art inductive loop sensors, time varying magnetic fields emitted through the viewport are not sensed. Instead, only the RF currents are sensed, resistively, on their return journey to the generator through the ground-return path. Typical plasma process might be driven by currents of 10's amps. On the outbound journey, these currents are shepherded through a well-defined and restricted current path. On the return journey, the return current spreads across the entire surface area of the ground-return elements e.g. chamber body etc. Therefore, the sensor will only "see" or detect a fraction of the return current determined by a) the ratio of the surface area of the sensor to the total surface area of the ground-return region where it is installed and b) the resistance of the sensing resistor. It may be that <<1 millionth of the outbound current would flow through the sensor on its return journey to the generator. This could be on the order of microamps, generating microvolts on the sensing resistor for detection.

The output of the RF current sensing resistor may be coupled to a signal processing unit. The signal processing unit provides information related to the remotely sensed RF spectra that have not been reported in prior art remote RF plasma sensor designs. Measurements include; a) the phase between the harmonics and the fundamental frequency, b) harmonic spectrum analysis in pulsed RF and frequency tuning plasma processes, c) rms detection of arcs and rms detection of individual pulsed RF profiles.

A statistical method may be used based on spectral fingerprinting of known "healthy" plasma process conditions. Variations in the phase and amplitude of the spectral components are analysed and a fault score can be attributed to each new process measurement. Thresholds can thus be configured to alert the user to detected process faults. The phase measurements are particularly sensitive to small changes in plasma chemistry and plasma impedance. The ability to measure phase between harmonics makes the sensor in accordance with the present teachings a very useful diagnostic tool for detection of subtle process changes that occur during low open area etching, for example, where standard end-pointing technology is now falling short.

As is known in the art, in a well shielded RF system, the current flowing in the central conductor is shielded by the current flowing in the surrounding grounded shield. These currents cancel each other so that the system does not "radiate" RF energy. The current invention makes use of discontinuities in grounded shielding. Unlike the prior art inductive loop sensors discussed earlier, the sensor is inserted in the ground-return path in a region where the currents do not fully cancel each other out, making measurement of the ground-return currents possible.

Figure 2:
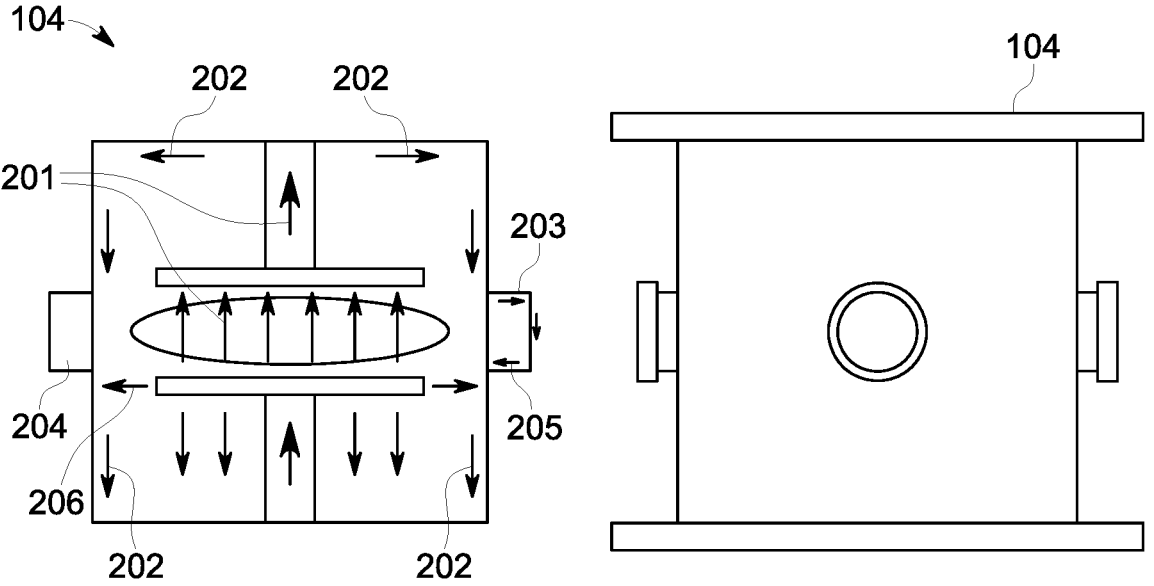
FIG. 2 shows a placement location of the sensor in the system of FIG. 1 in more detail.

Turning to FIG. 2, this shows a placement location of the sensor in accordance with the present teachings in more detail. In modern plasma tools, view port sizes are miniaturised and RF shielding is added to minimise RF leakage through the viewport. While optical detectors always need a viewport, there are many regions of the plasma system where the harmonic spectrum of the RF current can be determined if a gap in the ground-return shielding exists, or is added. To illustrate the capabilities of the current invention, the viewport will be used as the exemplar case. However, it will be appreciated that the sensor in accordance with the present teachings can be placed across any suitable opening in a ground-return path.

FIG. 2 shows two views of the plasma chamber 104. In particular, FIG. 2 shows the RF current entering the plasma chamber 104 i.e., central arrows 201, and commencing the ground-return journey through the chamber walls i.e., peripheral arrows 202. Two viewports are illustrated. The first viewport 203 has a sensor (not shown) in accordance with the present teachings attached. The second viewport 204 is without the sensor. The second viewport 204 without the sensor has no complete conducting path to allow current follow through the viewport cavity i.e. its front face is made of glass. However, when the sensor is attached to the first viewport 203, a path 205 for RF current flow across or through the viewport is created. This current flow can be measured by the sensor in accordance with the present teachings.

The installed sensor orientation on the viewport 203 is important for RF current sensing as will be explained in more detail with reference to FIG. 3. FIG. 2 shows that for the capacitively coupled plasma chamber 104, the RF current travels predominantly in the vertical direction into, and through, the chamber electrodes and plasma volume i.e., central arrows 201. The return current must, therefore, predominantly flow vertically in the chamber walls, in the opposing direction i.e., peripheral arrows 202. There will be some current flow to the walls from the plasma in other directions also, including the horizontal in FIG. 2 i.e., arrows 206.

Figure 3:
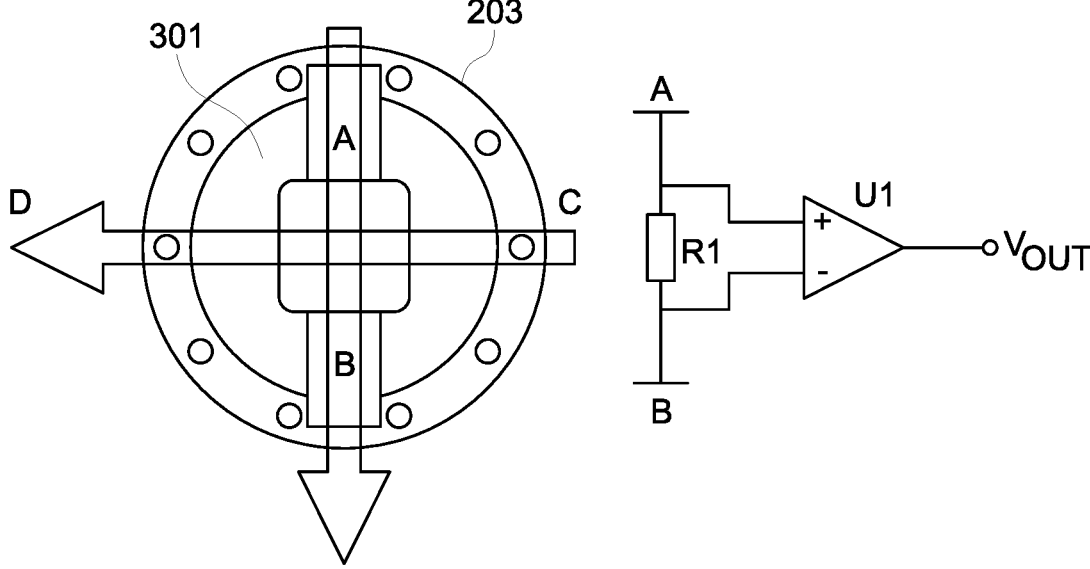
FIG. 3 shows the sensor in accordance with the present teachings mounted on a view port of the chamber as well as the internal configuration of the sensor.

Turning to FIG. 3, this depicts a sensor 301 in accordance with the present teachings mounted across the viewport 203 where the RF return current flows in the direction A to B. The direction A to B aligns with the current flow 202 shown in FIG. 2. In theory, there should be less RF current flowing in the direction C to D shown (this direction aligning with the current flow 206 of FIG. 2). As is known to the person skilled in the art there may be currents flowing in several directions in complex plasma processing systems, so the sensor can be orientated to measure the current of interest.

FIG. 3 also depicts the internal configuration of the sensor 301. As previously mentioned, the sensor 301 includes a sensing resistor R1. The ground return path is made up of conducting/metallic materials and surfaces with a very low resistivity. The sensing resistor R1 must, therefore, have a low resistance value to allow sufficient current flow through the sensor for detection. R1 in FIG. 3 has a resistance value of less than 1 Ohm. A voltage difference proportional to the current flow is generated across the resistor R1 and this voltage difference is measured. The circuit further includes an amplifier U1 to convert the RF current into a voltage signal $V_{OUT}$. That is, FIG. 3 shows a measurement circuit comprising a low valued resistor R1 in series with the direction of current flow and differential amplifier U1 to sense the voltage drop across R1. It should be appreciated that the output of the amplifier is not limited to a voltage signal and this could be any RF output such as a current signal.

The resistive sensing element R1 and the amplifier U1 are key elements of the analog front end of the sensor. The analog front end could be housed in a grounded metallic enclosure to shield the analog circuit from electric and magnetic fields that may be emitted through the viewport. However, this is not essential and a non-metallic housing could be used. The output of U1 may be coupled to a digitisation circuit for processing and analysis. The major advantages of using a resistive sensing element are a) the response if flat as a function of frequency, unlike inductive loop sensors, b) resistance is stable over a wide temperature range, unlike inductive loop sensors and c) common mode rejection is easier to achieve compared to inductive loops sensors.

It should be appreciated that any RF current sensing element could be used. The inventors have found that the above described sensing resistor is the most convenient element, but a low impedance capacitor or inductor could also be used in place of the resistor. An alternative detection circuit would be needed if a capacitor or inductor is used. Other methods could be applied to sense the current in the ground return path i.e. Hall effect sensor in the shunt connector or current transformer around the shunt connector.

The analog voltage output, $V_{OUT}$, is an alternating current (AC) signal in the RF band. To extract the frequency spectra in a form that can be analysed and visualised in a useful way, a signal processing unit is used. A co-axial cable carries the AC signals to the signal processing unit. An ADC is used to sample the current waveform. A data block of 512 samples is typically recorded as a first step. The block size is chosen arbitrarily and can be varied to meet different requirements. The data block is transferred to a field programmable gate array (FPGA) where a fast Fourier transform (FFT) is carried out. The FFT transforms the time domain AC waveform into a frequency spectrum. The frequency spectra are sent to a microprocessor for storage and further processing, including averaging. Multiple FFTs are averaged together to reduce the signal-to-noise ratio.

Figure 4:
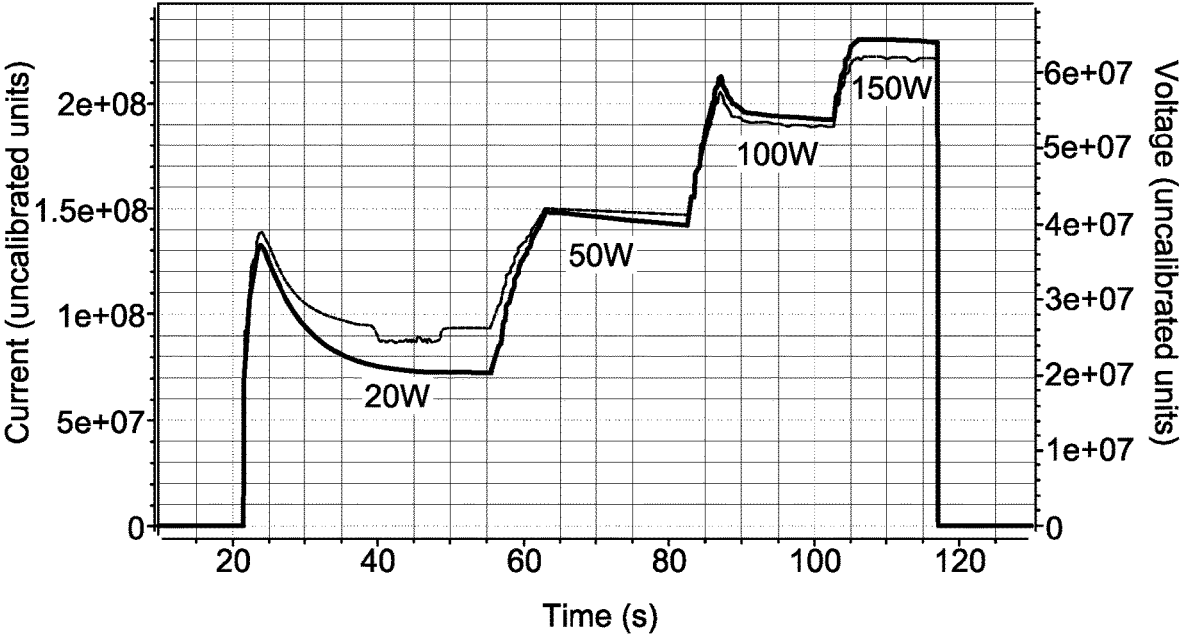
FIG. 4 shows test results achieved with the sensor in accordance with the present teachings.

A working example of the sensor in accordance with the present teaching is provided with reference to FIG. 4. For comparison purposes, the sensor may incorporate a separate E-field detector to measure the electric field emitted through the viewport. As mentioned above, sensor does not measure the E-field. The E-field detector gives a good reference point for the sensor current magnitude measurement. To demonstrate the functionality of the sensor, it was attached to the capacitively coupled plasma reactor illustrated in FIG. 1. In this example, the reactor has two parallel plate electrodes, each of 300 mm diameter. RF power is supplied at 13.56 MHz. The background gas used to form the plasma was Argon with a flow rate of 100 SCCM and held at a pressure of approximately 2 Pa. FIG. shows the amplitude of the fundamental 13.56 MHz frequency component plotted as a function of time while the RF power from the generator is increased from 20 W to 150 W. The current profile tracks the voltage profile very well. The data is uncalibrated, with the current scale being on the order of 108 data units.

That is, in FIG. 4 the sensor measurement of the amplitude of the fundamental (13.56 MHz) component of the RF current spectrum is shown compared with the fundamental component of the RF voltage spectrum emitted from the window. The change in process power can easily be identified by sensor. The sensor orientation is A to B as illustrated in FIG. 3.

Figure 5:
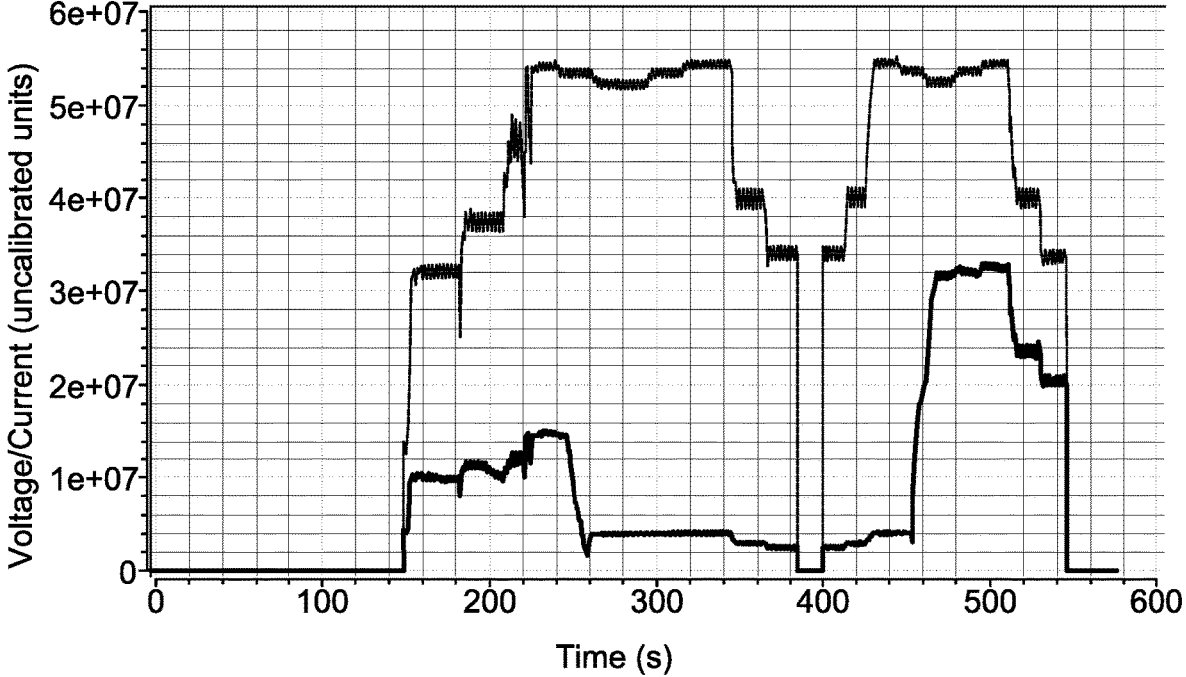
FIG. 5 shows further test results achieved with the sensor in accordance with the present teachings.

FIG. 5 shows a measurement of the fundamental current amplitude from the sensor compared against the E-field probe measurement, with the sensor installed in the C to D orientation shown in FIG. 3. The voltage amplitude is very similar to that shown in FIG. 4, as expected, since the E-field probe is not sensitive to the orientation. However, the current amplitude has dropped significantly to low 107 magnitude. This confirms that the sensor is truly sensitive to the ground-return current, with the expected drop in current seen with the alternative orientation of the installed sensor.

Figure 6:
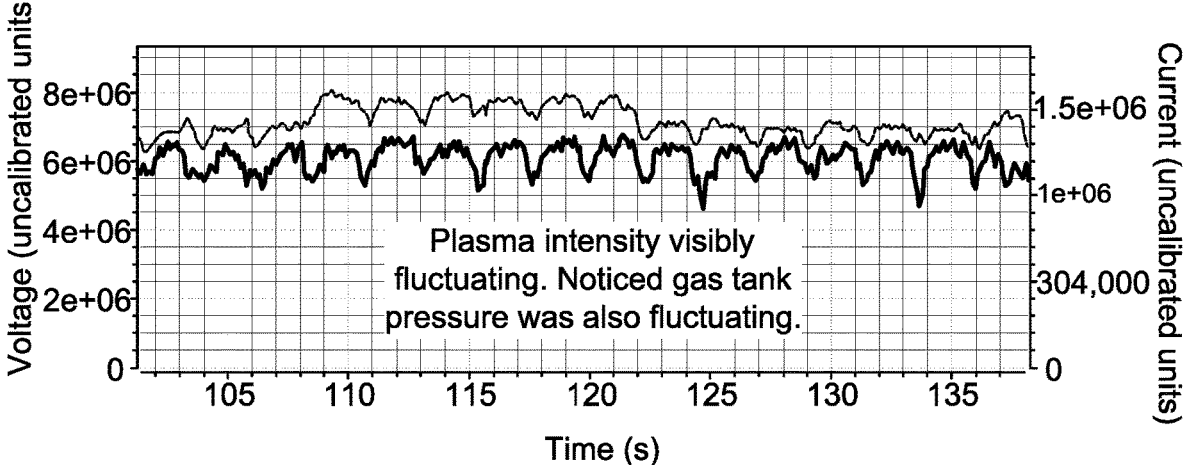
FIG. 6 shows how the sensor in accordance with the present teachings can be used to detect a fault.

FIG. 6 shows how an oscillation in the fundamental current signal amplitude correlates with a malfunctioning pressure value on the gas feed line, showing the capability of the sensor/probe in accordance with the represent teachings to monitor the health and performance of the plasma process.

Accordingly, there is provided by the present teachings a sensor for sensing RF current spectra in a plasma system from a non-invasive location external to the plasma chamber. The processed signals can be used to determine the health and stability of the process.

The sensor comprises of a shunt connector, with an RF current sensing element, attached across an opening in the ground-return path of the plasma system, such as a viewport. The output of the current sensing resistor is coupled to a measurement system to sample the RF current waveform which is then digitised and converted to Fourier space to analyse the harmonic frequency spectrum. The amplitude of each harmonic component is measured as well as the phase angle of each harmonic component relative to the fundamental frequency. The phase measurement is especially sensitive to RF impedance changes of the plasma.

The invention is not limited to the embodiment(s) described herein but can be amended or modified without departing from the scope of the present invention.

The invention claimed is:

1. A system for non-Invasive sensing of radio-frequency current spectra comprising:
   - a plasma processing chamber;
   - a plasma generator;
   - a shunt connector having a resistor therein, the shunt connector bridging an opening in a ground-return path between the chamber and the generator; and an amplifier configured to detect the voltage drop generated by the resistor and output an RF signal.

2. The system of claim 1, wherein the system is configured to detect current flowing through the ground-return path.

3. The system of claim 2, wherein the system is configured such that current flowing through the ground-return path generates a voltage in the resistor.

4. The system of claim 1, wherein the shunt connector is configured to be attached across a viewport of the chamber.

5. The system of claim 1, further comprising a digitisation circuit configured to take the RF signal from the amplifier and convert it to a digital signal for processing and analysis.

6. The system of claim 5, wherein the RF signal is an alternating current signal in the RF band.

7. The system of claim 1 wherein the RF signal is an alternating current signal in the RF band.

8. The system of claim 1, further comprising a housing in which the resistor and amplifier are enclosed.

9. The system of claim 1, wherein the system is configured such that the shunt connector and the resistor create a path for current to flow as part of the ground-return path.

10. The system of claim 9, wherein the path created by the shunt connector and the resistor is orientated in the same direction as current flow in the ground-return path.

11. The system of claim 1, wherein the shunt connector comprises at least one of a ground shunt strap, cable, bar and rod.

12. A method for non-Invasive sensing of radio-frequency current spectra flowing in a plasma processing chamber comprising:

providing a shunt connector having a resistor therein; and attaching the shunt connector across an opening in a ground-return path between the chamber and a plasma generator; and coupling an amplifier to the shunt connector to detect the voltage drop generated by the resistor and output an RF signal.

13. The method of claim 12, further comprising detecting current flowing through the ground-return path.

14. The method of claim 13, wherein current flowing through the ground return path generates a voltage in the resistor.

15. The method of claim 12, further comprising attaching the shunt connector across a viewport of the chamber.

16. The method of claim 13, further comprising attaching the shunt connector across a viewport of the chamber.

\* \* \* \* \*